(12) United States Patent
Ibe

(10) Patent No.: US 8,207,665 B2
(45) Date of Patent: Jun. 26, 2012

(54) ELECTROLUMINESCENCE DEVICE

(75) Inventor: Takahiro Ibe, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 92 days.

(21) Appl. No.: 12/480,963

(22) Filed: Jun. 9, 2009

(65) Prior Publication Data

US 2010/0051990 A1    Mar. 4, 2010

Related U.S. Application Data

(63) Continuation of application No. 10/763,101, filed on Jan. 22, 2004, now Pat. No. 7,199,521.

(30) Foreign Application Priority Data

Jan. 29, 2003 (JP) .................................. 2003-020152

(51) Int. Cl.
*H05B 33/12* (2006.01)
(52) U.S. Cl. ...................................... 313/506; 313/509
(58) Field of Classification Search ........... 313/504–512
See application file for complete search history.

(56) References Cited

U.S. PATENT DOCUMENTS

| | | | |
|---|---|---|---|
| 3,388,277 A * | 6/1968 | Thornton, Jr. ................ | 313/509 |
| 4,741,976 A | 5/1988 | Eguchi et al. | |
| 4,871,236 A | 10/1989 | Gemma et al. | |
| 4,971,919 A | 11/1990 | Yamazaki | |
| 5,478,777 A | 12/1995 | Yamazaki | |
| 5,677,546 A | 10/1997 | Yu | |
| 5,682,043 A | 10/1997 | Pei et al. | |
| 5,837,391 A | 11/1998 | Utsugi | |
| 5,917,280 A | 6/1999 | Burrows et al. | |
| 5,970,318 A | 10/1999 | Choi et al. | |
| 5,982,345 A | 11/1999 | Takayama et al. | |

(Continued)

FOREIGN PATENT DOCUMENTS

CN    1330414 A    1/2002

(Continued)

OTHER PUBLICATIONS

Ferraris, J. et al, "Electron Transfer in a New Highly Conducting Donor-Acceptor Complex," Journal of the American Chemical Society, vol. 95, No. 3, Feb. 7, 1973, pp. 948-949.

(Continued)

*Primary Examiner* — Joseph L Williams
(74) *Attorney, Agent, or Firm* — Husch Blackwell LLP

(57) ABSTRACT

An organic EL element has excellent features as compared with other electroluminescent elements, but on the other hand, has a problem that the life of the element is not sufficiently long. In addition, since the organic EL element is expected to be applied to a mobile display and the like, it is also important to improve power efficiency. Hence, an object of the invention is to provide an element structure to realize an improvement in power efficiency and an improvement in the life of the element at the same. In the construction of an organic EL element of the invention, the first electroluminescent film 303 is sandwiched by the first anode 302 and a cathode 304, and the second electroluminescent film 305 and the second anode 306 are laminated over the cathode 304. At this time, the first anode 302 is put into contact with the second anode 306 to form a parallel circuit to decrease an electric current passing through the respective electroluminescent films.

10 Claims, 10 Drawing Sheets

U.S. PATENT DOCUMENTS

| | | | |
|---|---|---|---|
| 6,013,384 A | 1/2000 | Kido et al. |
| 6,064,151 A | 5/2000 | Choong et al. |
| 6,107,734 A | 8/2000 | Tanaka et al. |
| 6,188,175 B1 | 2/2001 | May et al. |
| 6,198,091 B1 | 3/2001 | Forrest et al. |
| 6,198,092 B1 | 3/2001 | Bulovic et al. |
| 6,278,055 B1 | 8/2001 | Forrest et al. |
| 6,297,495 B1 | 10/2001 | Bulovic et al. |
| 6,297,516 B1 | 10/2001 | Forrest et al. |
| 6,300,612 B1 | 10/2001 | Yu |
| 6,352,777 B1 | 3/2002 | Bulovic et al. |
| 6,423,429 B2 | 7/2002 | Kido et al. |
| 6,451,415 B1 | 9/2002 | Forrest et al. |
| 6,452,092 B2 | 9/2002 | Han et al. |
| 6,515,310 B2 | 2/2003 | Yamazaki et al. |
| 6,524,884 B1 | 2/2003 | Kim et al. |
| 6,566,806 B1 | 5/2003 | Kawai |
| 6,580,213 B2 | 6/2003 | Yamazaki |
| 6,692,820 B2 | 2/2004 | Forrest et al. |
| 6,739,931 B2 | 5/2004 | Yamazaki et al. |
| 6,806,641 B2 | 10/2004 | Ueda et al. |
| 6,844,025 B2 | 1/2005 | Forrest et al. |
| 6,858,878 B2 | 2/2005 | Yamazaki et al. |
| 6,900,470 B2 | 5/2005 | Kobayashi et al. |
| 6,936,964 B2 | 8/2005 | Cok |
| 6,995,511 B2 | 2/2006 | Yamazaki et al. |
| 7,053,890 B2 | 5/2006 | Inukai |
| 7,118,810 B2 | 10/2006 | Park et al. |
| 7,208,868 B2 | 4/2007 | Ueda et al. |
| 7,291,969 B2 | 11/2007 | Tsutsui |
| 7,459,849 B2 | 12/2008 | Yamazaki et al. |
| 7,514,868 B2 | 4/2009 | Yamazaki et al. |
| 2001/0031509 A1 | 10/2001 | Yamazaki |
| 2001/0035714 A1 | 11/2001 | Lu |
| 2001/0046611 A1 | 11/2001 | Kido et al. |
| 2002/0028347 A1 | 3/2002 | Marrocco, III et al. |
| 2002/0105265 A1 | 8/2002 | Chuang |
| 2002/0119297 A1 | 8/2002 | Forrest et al. |
| 2002/0173068 A1 | 11/2002 | Kido et al. |
| 2002/0189666 A1 | 12/2002 | Forrest et al. |
| 2002/0197462 A1 | 12/2002 | Forrest et al. |
| 2003/0042846 A1 | 3/2003 | Forrest et al. |
| 2003/0127967 A1 | 7/2003 | Tsutsui et al. |
| 2003/0170491 A1* | 9/2003 | Liao et al. ............... 428/690 |
| 2003/0189401 A1 | 10/2003 | Kido et al. |
| 2003/0209974 A1 | 11/2003 | Yamazaki |
| 2003/0218166 A1 | 11/2003 | Tsutsui |
| 2004/0027059 A1 | 2/2004 | Tsutsui |
| 2004/0027061 A1 | 2/2004 | Seo et al. |
| 2004/0113546 A1 | 6/2004 | Forrest et al. |
| 2004/0150333 A1 | 8/2004 | Tsutsui |
| 2004/0151887 A1 | 8/2004 | Forrest et al. |
| 2005/0001541 A1 | 1/2005 | Yamazaki et al. |
| 2005/0023522 A1 | 2/2005 | Frey et al. |
| 2009/0243464 A1 | 10/2009 | Yamazaki et al. |

FOREIGN PATENT DOCUMENTS

| | | |
|---|---|---|
| EP | 0 215 683 B1 | 3/1987 |
| EP | 0 855 848 A2 | 7/1998 |
| EP | 0 948 063 A2 | 10/1999 |
| EP | 1 134 817 A2 | 9/2001 |
| EP | 1 178 462 A2 | 2/2002 |
| JP | 60-28278 | 2/1985 |
| JP | 4-192376 | 7/1992 |
| JP | 6-176870 | 6/1994 |
| JP | 6-318725 | 11/1994 |
| JP | 9-199276 | 7/1997 |
| JP | 10-199678 | 7/1998 |
| JP | 10-270171 | 10/1998 |
| JP | 11-251067 | 9/1999 |
| JP | 11-329748 | 11/1999 |
| JP | 2001-244074 | 9/2001 |
| JP | 2001-267083 | 9/2001 |
| JP | 2001-291592 | 10/2001 |
| JP | 2001-357975 | 12/2001 |
| JP | 2002-33185 | 1/2002 |
| JP | 2002-33193 | 1/2002 |
| JP | 2002-164170 | 6/2002 |
| JP | 2002-164181 | 6/2002 |
| JP | 2002-318556 | 10/2002 |
| JP | 2003-45676 | 2/2003 |
| JP | 2003-515933 | 5/2003 |
| JP | 2004-111085 | 4/2004 |
| WO | WO 02/101838 A1 | 12/2002 |
| WO | WO 2004/112440 A1 | 12/2004 |

OTHER PUBLICATIONS

Fuchigami, H. et al, "Polythienylenevinylene Thin-Film Transistor with High Carrier Mobility," Applied Physics Letters, vol. 63, No. 10, Sep. 6, 1993, pp. 1372-1374.

Yu, G. et al, "Charge Separation and Photovoltaic Conversion Polymer Composites with Internal Donor/Acceptor Heterojunctions," J. Appl. Phys., vol. 78, No. 7, Oct. 1, 1995, pp. 4510-4515.

Gundlach, D.J. et al, "Pentacene Organic Thin-Film Transistors—Molecular Ordering and Mobility," IEEE Electron Device Letters, vol. 18, No. 3, Mar. 1997, pp. 87-89.

Ruhstaller, B. et al, "Bias-Tuned Reduction of Self-Absorption in Polymer Blend Electroluminescence," Chemical Physics Letters, vol. 317, Feb. 4, 2000, pp. 238-244.

Narayan, K.S. et al, "Light Responsive Polymer Field-Effect Transistor," Applied Physics Letters, vol. 79, No. 12, Sep. 17, 2001, pp. 1891-1893.

Shirakawa, H. et al, "Synthesis of Electrically Conducting Organic Polymers: Halogen Derivatives of Polyacetyrene (CH)x," J.C.S. Chem. Comm., No. 16, 1977, pp. 578-580.

Tang, C.W., "Two-Layer Organic Photovoltaic Cell," Applied Physics Letters, vol. 48, No. 2, Jan. 13, 1986, pp. 183-185.

Tang, C.W. et al, "Organic Electroluminescent Diodes," Applied Physics Letters, vol. 51, No. 12, Sep. 21, 1987, pp. 913-915.

Hiramoto, M. et al, "Effect of Thin Gold Interstitial-Layer on the Photovoltaic Properties of Tandem Organic Solar Cell," Chemistry Letters, 1990, pp. 327-330.

Tsutsui, T., "The Operation Mechanism and the Light Emission Efficiency of the Organic EL Element," *Textbook of the 3rd Seminar at Division of Organic Molecular Electronics and Bioelectronics*, The Japan Society of Applied Physics,1993, pp. 31-37, (with full English translation, pp. 1-11).

Parthasarathy, G. et al, "A Metal-Free Cathode for Organic Semiconductor Devices," J. Appl. Phys., vol. 72, No. 17, Apr. 27, 1998, pp. 2138-2140.

Sato, Y., "Problem for Implementation in View of Materials Development," Concise Statement, The Japan Society of Applied Physics/Organic Molecular Electronics and Bioelectronics, vol. 11, No. 1, 2000, pp. 86-99.

International Search Report re application No. PCT/JP2004/000206, dated Feb. 24, 2004 (in Japanese).

Written Opinion re application No. PCT/JP2004/000206, dated Feb. 24, 2004 (with partial English translation).

Office Action re Chinese application No. CN 200480002841.0, dated Jan. 23, 2009 (with English translation).

Hiramoto, M. et al, "Effect of Thin Gold Interstitial-Layer on the Photovoltaic Properties of Tandem Organic Solar Cell," Chemistry Letters, vol. 19, No. 3, 1990, pp. 327-330.

* cited by examiner

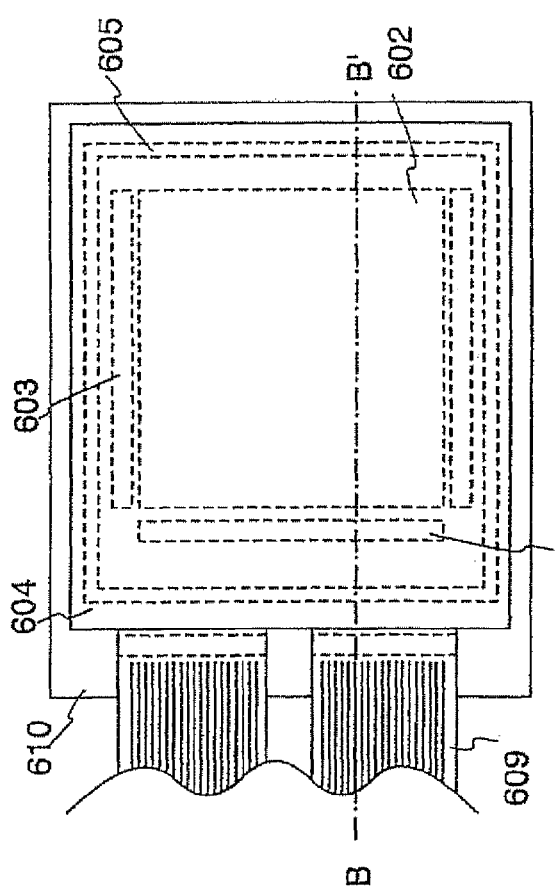
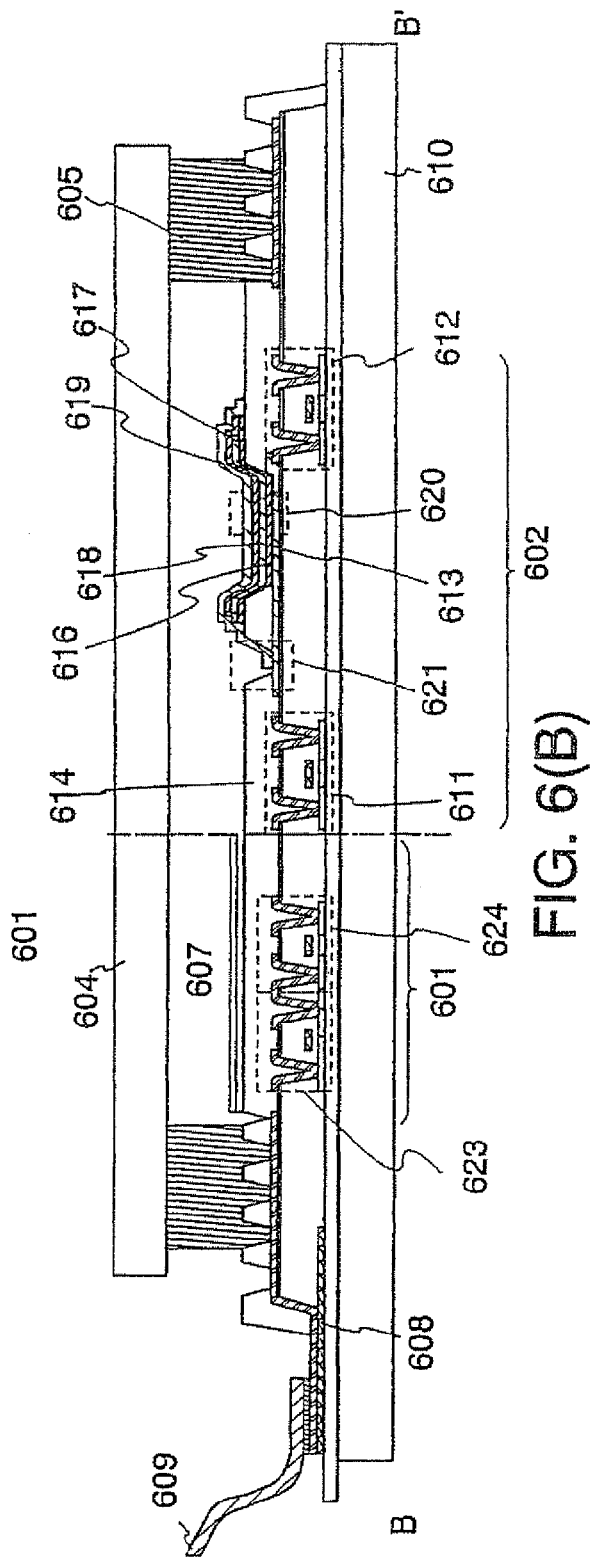
FIG. 6(A)
FIG. 6(B)

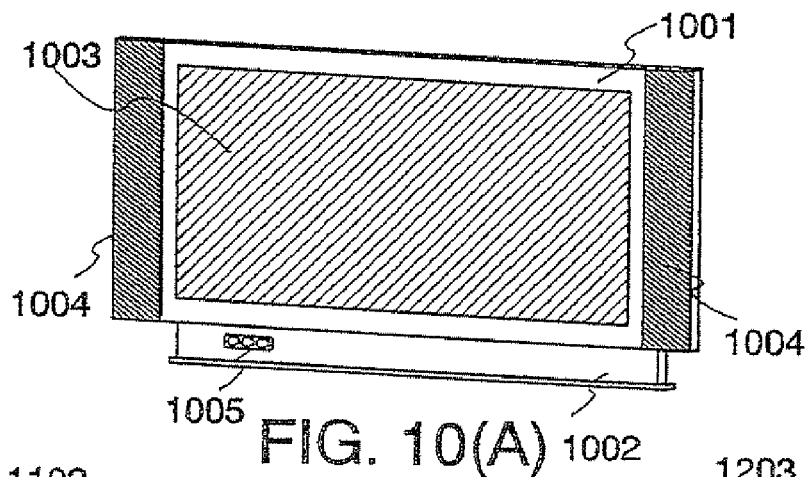
FIG. 10(A)
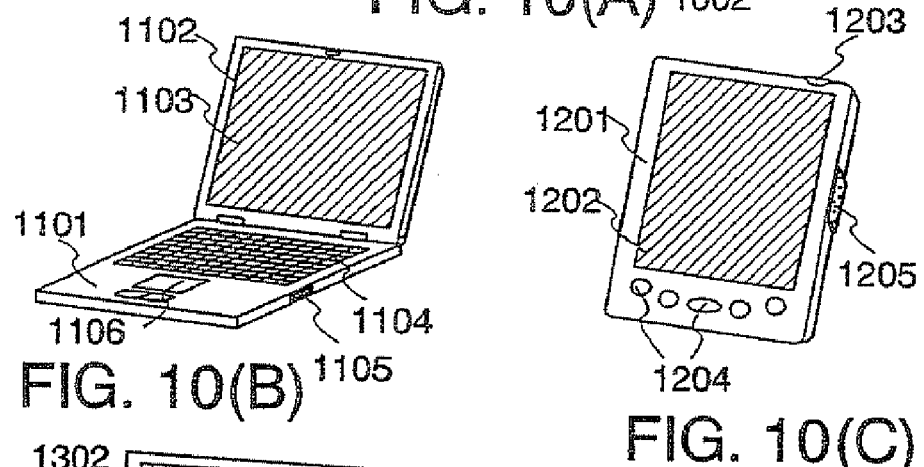
FIG. 10(B)
FIG. 10(C)
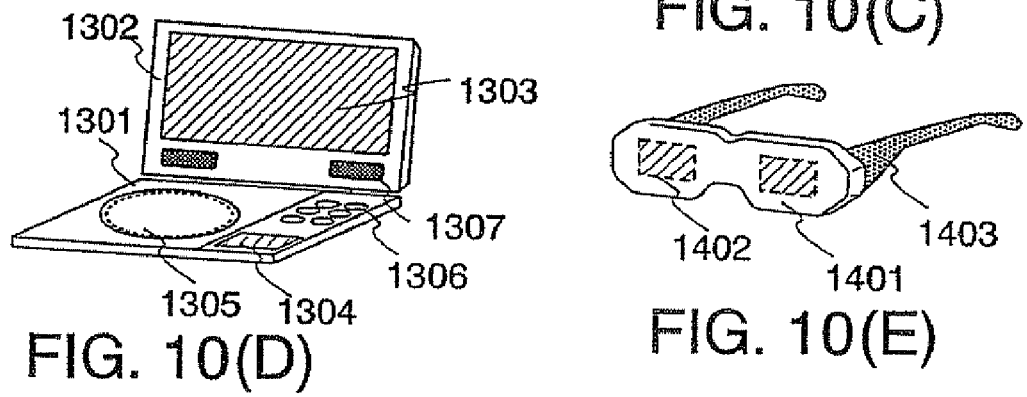
FIG. 10(D)
FIG. 10(E)
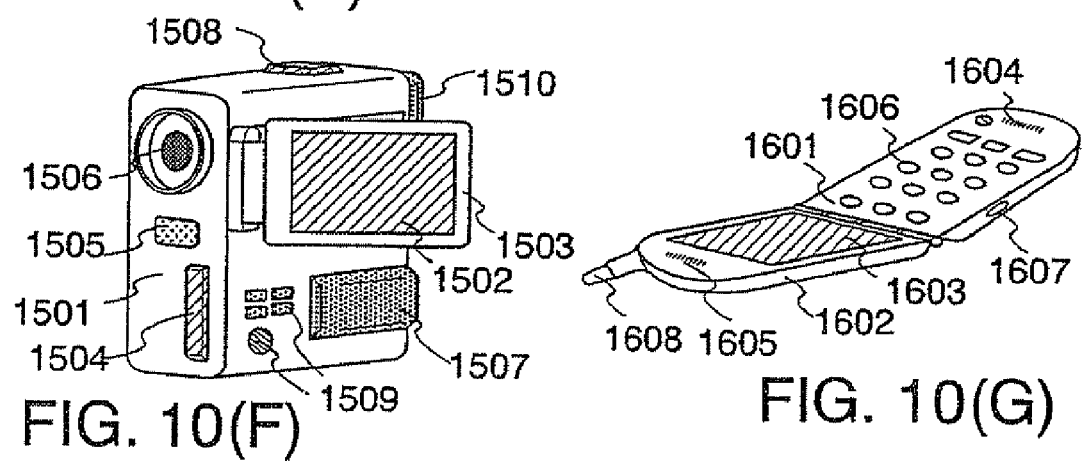
FIG. 10(F)
FIG. 10(G)

ELECTROLUMINESCENCE DEVICE

This application is a continuation of U.S. application Ser. No. 10/763,101 filed Jan. 22, 2004 now U.S. Pat. No. 7,199,521.

FIELD OF THE INVENTION

The present invention relates to an electroluminescence device with an anode, a cathode and a layer comprising an organic compound that emits light by applying an electrical voltage.

BACKGROUND OF THE INVENTION

Compared to inorganic compounds, organic compounds include more varied material systems, and through appropriate molecular design it is possible to synthesize organic materials having various functionalities. Further, the organic compound is characterized in that films and the like formed using the organic compound demonstrate great pliancy, and superior processability can also be achieved by polymerization. In light of these advantages, in recent years, attention has been given to photonics and electronics employing functional organic materials.

Photonic techniques which make use of photophysical qualities of organic compounds have already played an important role in contemporary industrial techniques. For example, photosensitive materials, such as a photoresist, have become indispensable in a photolithography technology used for fine processing of semiconductors. In addition, since the organic compounds themselves have properties of light absorption and concomitant light emission (fluorescence or phosphorescence), they have considerable applicability as light emitting materials such as laser pigments and the like.

On the other hand, since organic compounds do not have carriers themselves, they essentially have superior insulation properties. Therefore, in the field of electronics where the electrical properties of organic materials are utilized, the main conventional use of organic compounds is insulators, where organic compounds are used as insulating materials, protective materials and covering materials.

However, there are means for making massive amounts of electrical current flow in the organic materials which is essentially insulators, and they are starting to be put to practical use in the electronics field. The means discussed here can be broadly divided into two categories.

The first of these, represented by conductive polymers, is means in which a π-conjugate system organic compound is doped with an acceptor (electron acceptor) or a donor (electron donor) to give the π-conjugate system organic compound a carrier "Synthesis of Electrically Conducting Organic Polymers: Halogen Derivatives of Polyacetyrene, $(CH)_x$)" by Hideki Shirakawa et al., Chemical Communications, 1977, 16, 578-580. By increasing the doping amount, the carrier will increase up to a certain area. Therefore, its dark conductivity will also increase together with this, so that significant electricity will be made to flow.

Since the amount of the electrical flow can reach the level of a normal semiconductor or more, a group of materials which exhibit this behavior can be referred to as organic semiconductors (or, in some cases, organic conductors).

This means of doping the acceptor/donor to improve the dark conductivity to make the electrical current flow in the organic material is already being applied in part of the electronics field. Examples thereof include a rechargeable storage battery using polyaniline or polyacene and an electric field condenser using polypyrrole.

The other means for making massive electrical current flow in the organic material uses an SCLC (Space Charge Limited Current). The SCLC is an electrical current which is made to flow by injecting a space charge from the outside and moving it, the current density of which is expressed by Child's Law, i.e., Formula (1), shown below. In the formula, J denotes a current density, $\in$ denotes a relative dielectric constant, $\in_0$ denotes a vacuum dielectric constant, μ denotes a carrier mobility, V denotes a voltage, and d denotes a distance (hereinafter, referred to as "thickness") between electrodes applied with the voltage V:

[Formula 1]

$$J = 9/8 \cdot \in \in_0 \mu \cdot V^2/d^3 \qquad (1)$$

Note that the SCLC is expressed by Formula (1) in which no carrier trap when the SCLC flows is assumed at all. The electric current limited by the carrier trap is referred to as a TCLC (Trap Charge Limited Current), and it is proportionate to a power of the voltage, but both the SCLC and the TCLC are currents that are subject to bulk limitations. Therefore, both the SCLC and the TCLC are dealt with in the same way hereinbelow.

Here, for comparison, Formula (2) is shown as a formula expressing the current density when an Ohm current flows according to Ohm's Law. σ denotes a conductivity, and E denotes an electric field strength:

[Formula 2]

$$J = \sigma E = \sigma \cdot V/d \qquad (2)$$

In Formula (2), since the conductivity C is expressed as σ=neμ (where n denotes a carrier density, and e denotes an electric charge), the carrier density is included in the factors governing the amount of the electrical current that flows. Therefore, in an organic material having a certain degree of carrier mobility, as long as the material's carrier density is not increased by doping as described above, the Ohm current will not flow in a material which normally does not have few carriers.

However, as is seen in Formula (1), the factors which determine the SCLC are the dielectric constant, the carrier mobility, the voltage, and the thickness. The carrier density is irrelevant. In other words, even in the case of an organic material insulator with no carrier, by making the thickness d sufficiently small, and by selecting a material with a significant carrier mobility μ, it becomes possible to inject a carrier from the outside to make the current flow.

Even when this means is used, the current flow amount can reach the level of a normal semiconductor or more. Thus, an organic material with a great carrier mobility μ, in other words, an organic material capable of latently transporting a carrier, can be called an organic semiconductor.

Incidentally, even among organic semiconductor elements which use the SCLC as described above, organic electroluminescent elements (herein after, referred to as "organic EL elements") which use both the photonic and electrical qualities of functional organic material as photoelectronic devices, have particularly demonstrated remarkable advancement in recent years.

The most basic structure of the organic EL element was in year of 1987. "Organic Electroluminescent Diodes" by C. W. Tan et al., Applied Physics Letters, Vol. 51, No. 12, 913-915 (1987). The element reported in Non-patent document 2 is a type of diode element in which electrodes sandwich an organic thin film having a total thickness of approximately 100 nm and being constituted by laminating a hole-transporting organic compound and an electron-transporting organic compound, and the element uses a light emitting material (fluorescent material) as the electron-transporting compound. By applying voltage to the element, light-emission can be achieved like a light emitting diode.

The light-emission mechanism is considered to work as follows. That is, by applying the voltage to the organic thin film sandwiched by the electrodes, the hole and the electron injected from the electrodes are recombined inside the organic thin film to form an excited molecule (herein after, referred to as a "molecular exciton"), and light is emitted when this molecular exciton returns to its base state.

Note that, types of molecular excitons formed by the organic compound can include a singlet excited state and a triplet excited state, and the base state is normally the singlet state. Therefore, emitted light from the singlet excited state is referred to as fluorescent light, and the emitted light from the triplet excited state is referred to as phosphorescent light. The discussion in this specification covers cases of contribution to the emitted light from both of the excited states.

In the case of the organic EL element described above, the organic thin film is normally formed as a thin film having a thickness of about 100 to 200 nm. Further, since the organic EL element is a self-luminous element in which light is emitted from the organic thin film itself, there is no need for such a back light as used in a conventional liquid crystal display. Therefore, the organic EL element has a great advantage in that it can be manufactured to be extremely thin and lightweight.

Further, in the thin film having a thickness of about 100 to 200 nm, for example, the time from when the carrier is injected to when the recombination occurs is approximately several tens of nanoseconds, given the carrier mobility exhibited by the organic thin film. Even when the time required by for the process form the recombination of the carrier to the emission of the light, it is less than an order of microseconds before the light emission. Therefore, one characteristic of the organic thin film is that response time thereof is extremely fast.

Because of the above-mentioned properties of thinness and lightweightness, the quick response time, and the like, the organic EL element is receiving attention as a next generation flat panel display element. Further, since it is self-luminous and its visible range is broad, its visibility is relatively good and it is considered effective as an element used in display screens of portable devices.

The organic EL element has excellent features described above, on the other hand, the reason why it is not yet widely put into actual use is a drawback that the life of the element is not sufficiently long.

In an electroluminescent film constructing the organic EL element, the deterioration of function of its organic semiconductor is accelerated by the passage of electric current. It is known that in the organic EL element, the life of the element (half-life of luminescent luminance) deteriorates in a manner nearly inversely proportional to initial luminance, in other words, inversely proportional to the amount of electric current to be passed. The Japan Society of Applied Physics, Journal of Molecular Electronics and Bioelectronics, Vol. 11, No. 1 (2000), 86-99.

From this fact, it can be said that to decrease the amount of electric current passing through the electroluminescent film of the organic EL element is important not only from the viewpoint of power consumption but also from the viewpoint of the life of the element.

Therefore, an object of the invention is to provide an element structure that reduces the amount of electric current passing through the electroluminescent film of an organic EL element to improve the life of the element.

SUMMARY OF THE INVENTION

The invention is a electroluminescence device that includes: the first electrode formed on a substrate; the first electroluminescent film in contact with the first electrode; the second electrode in contact with the first electroluminescent film; the second electroluminescent film in contact with the second electrode; and the third electrode in contact with the second electroluminescent film, and is characterized in that the first electrode and the third electrode function as one of an anode or a cathode and in that the second electrode function as the other of the anode or the cathode.

Here, the first electrode and the third electrode may be electrically connected to each other.

Further, the invention is an electroluminescence device having another construction characterized in that a plurality of anodes and a plurality of cathodes are alternately formed over a substrate and in that electroluminescent films are formed between the respective anodes and cathodes.

In the electroluminescence device, the plurality of anodes may be electrically connected to each other and the plurality of cathodes may be electrically connected to each other.

Further, in the electroluminescence device, light can be taken out from a substrate side by preventing only the electrode farthest from the substrate, of the electrode selected from any of the anodes and cathodes, from transmitting light.

Still further, in the electroluminescence device, light can be also taken out from the opposite side of the substrate by preventing only the electrode closest to the substrate, of the electrode selected from any of the anodes and the cathodes, from transmitting light.

Still further, in the electroluminescence device, light can be also taken out from both of the substrate side and the opposite side of the substrate by making all of the anodes and the cathodes included in the light emitting element transmissive.

In this regard, in the electroluminescence device, two or more kinds of electroluminescent elements each of which emits different light can be used for the plurality of electroluminescent elements.

In addition, in the electroluminescence device, white light can be also emitted by using at least one electroluminescent element of emitting red light, at least one electroluminescent element of emitting green light, and at least one electroluminescent element of emitting blue light as the plurality of electroluminescent elements.

In this regard, the electroluminescence device in this specification means an image display device or an electroluminescence device using an electroluminescent element having an electroluminescent film as an electroluminescent element. Moreover, the electroluminescence device includes all of a module in which a electroluminescent element is mounted with a connector, for example, an anisotropic conductive film (ACF) or a tape automated bonding (TAB) tape or a tape carrier package (TCP), a module in which a printed wiring board is mounted on the tip of a TAB tape or a TCP, and a module in which a electroluminescent element is directly mounted with an integrated circuit (IC) by a chip on glass (COG) method.

The invention is characterized in that power efficiency per unit area can be improved by connecting the electroluminescent films in parallel to the electrodes and by laminating them vertically. In addition, the life of the element can be improved by decreasing the amount of electric current supplied to the electroluminescent films.

BRIEF DESCRIPTION OF THE DRAWINGS

FIGS. 6(A) and 6(B) are illustrations to show an electroluminescence device of an active matrix structure.

FIGS. 10(A) to 10(G) show applications of an electroluminescence device.

DETAILED DESCRIPTION OF THE PRESENTLY PREFERRED EMBODIMENTS (Mode 1)

Figure 1:
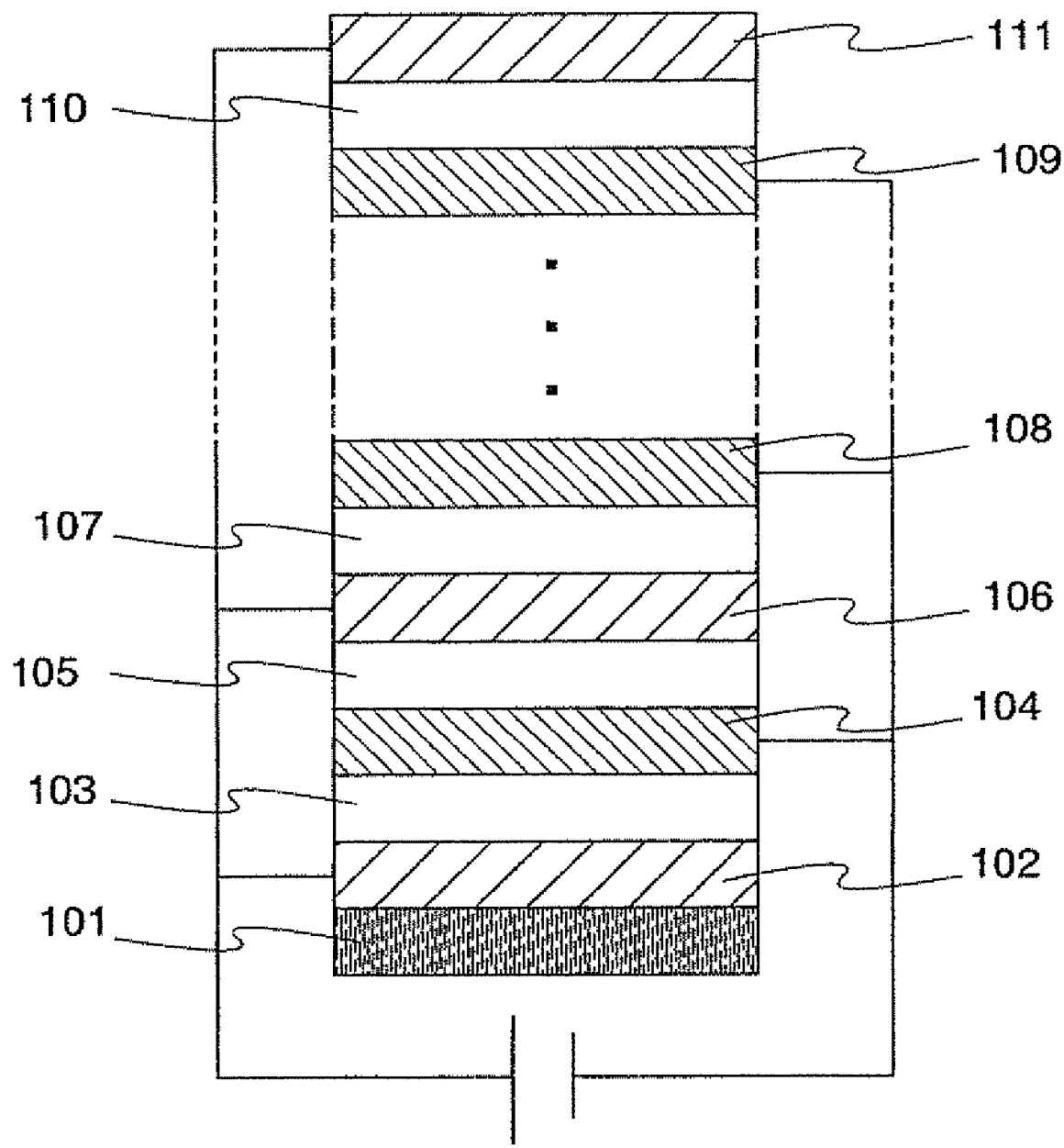
FIG. 1 is an illustration to show the fundamental construction of the invention.
Figure 2:
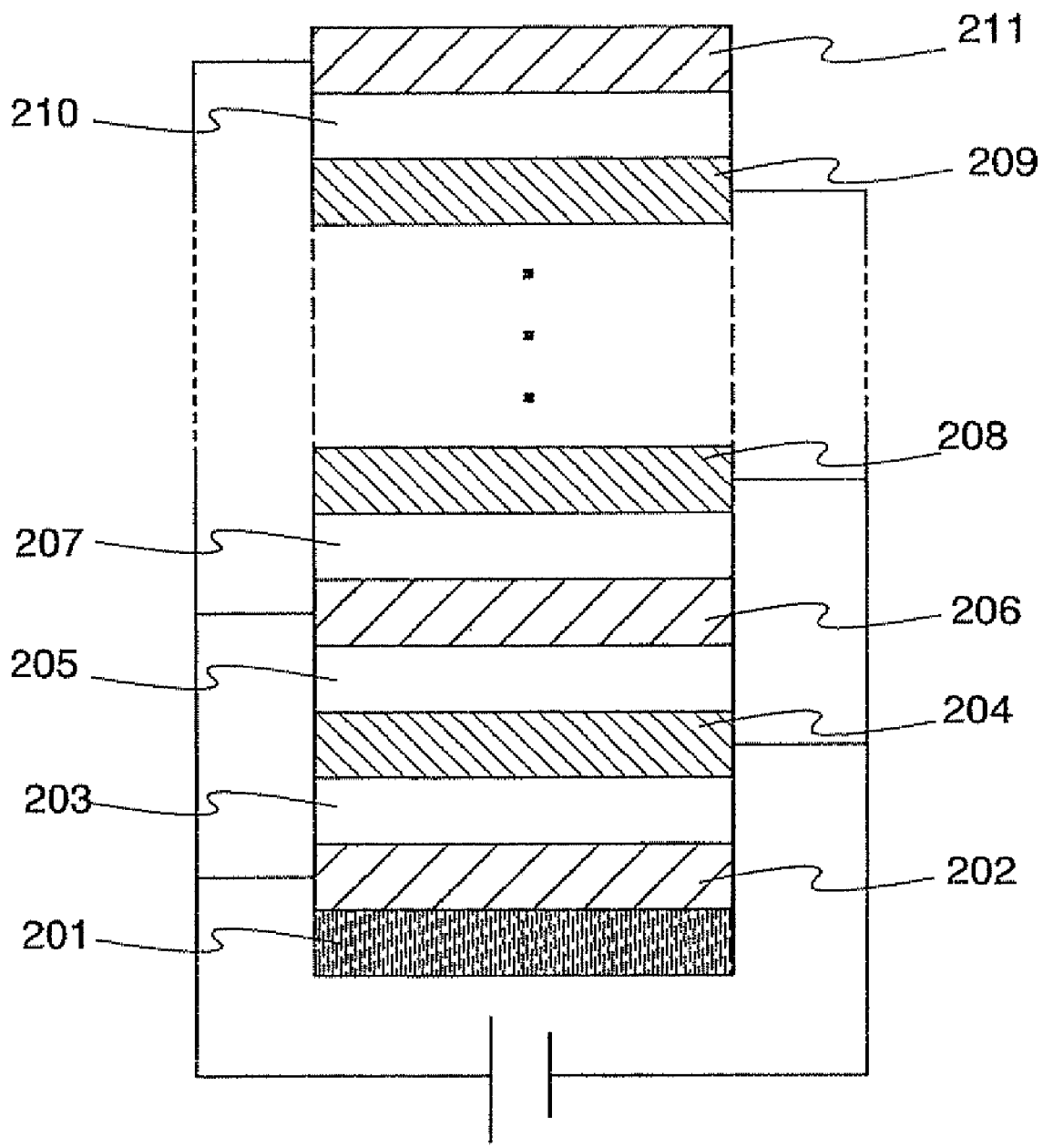
FIG. 2 is an illustration to show the fundamental construction of the invention.

FIG. 1 and FIG. 2 are schematic views of the invention. In FIG. 1, anodes and cathodes that are connected to the same external electrode are provided on a substrate 101 alternately in the order closer to the substrate as follows: the first anode 102, the first cathode 104, the second anode 106, the second cathode 108, ..., the n-th cathode 109, and the (n+1)-th anode 111. The first electroluminescent film 103 is formed between the first anode 102 and the first cathode 104; the second electroluminescent film 105 is formed between the first cathode 104 and the second anode 106; the third electroluminescent film 107 is formed between the second anode 106 and the second cathode 108; and the 2n-th electroluminescent film 110 is formed between the n-th cathode 109 and the (n+1)th anode 111, and one electroluminescent element is formed by the electroluminescent film sandwiched between a pair of the anode and the cathode. FIG. 2 is an example in which electrodes are laminated on a substrate 201 in such an order as a cathode 202, an anode 204, a cathode 206, ..., an anode 209, and a cathode 211, and in which electroluminescent films 203, 205, 207, 210 are formed between the electrodes, respectively. FIG. 2 is identical to FIG. 1 except that only the order of lamination of the electrodes is different.

Further, in FIG. 1 and FIG. 2, when the lamination of the electrodes on the substrate starts with the anode, it ends with the anode and when the lamination of the electrodes on the substrate starts with the cathode, it ends with the cathode. However, needless to say, even if the lamination of the electrodes starts with the anode, it may end with the cathode, and vice versa. It is recommendable to set the number of anodes and cathodes to be laminated at a suitable one as required.

Further, a substance excellent in hole injection is suitable for each anode and a substance having a large work function (about 4.5 to 5.5 eV) is preferably used for the anode. The substance includes, for example, Ti, TiN, TiSi$_x$N$_y$, Ni, W, WSi$_x$, WN$_x$, WSi$_x$N$_y$, NbN, Mo, Cr, Pt, Se, Pd, Ir, and Au, and a mixture or an alloy of these. It is said that a substance excellent in hole injection and having a small work function (about 2.5 to 3.5 eV) (typically, a metal element belonging to the 1st group or the 2nd group of the periodic table) or an alloy containing these substances is preferably used for the cathode. Among them, alloys such as MgAg, MgIn, and AlLi are desirable as the material used for the cathode.

(Mode 2)

The fundamental principle of the invention will be described on the basis of the structure shown in FIG. 3, which is a minimum construction in the invention. Here, a word of "transmissive" means "transparent", or "in a state sufficient for transmitting light".

Figure 3:
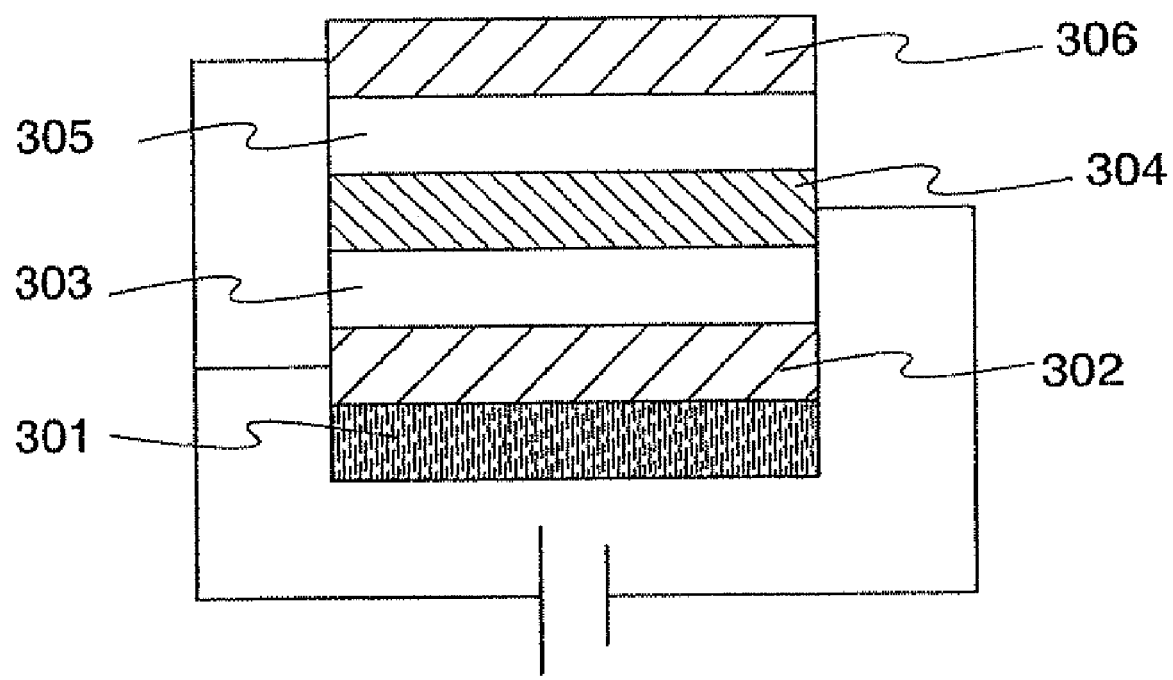
FIG. 3 is an illustration to show the minimum construction of the fundamental construction of the invention.

FIG. 3 is an example in which the first anode 302, the first electroluminescent film 303, a cathode 304, the second electroluminescent film 305, the second anode 306 are formed over the transmissive substrate 301. Transmissive electrodes are used for the first anode 302, the cathode 304, and the second anode 306.

Figure 4:
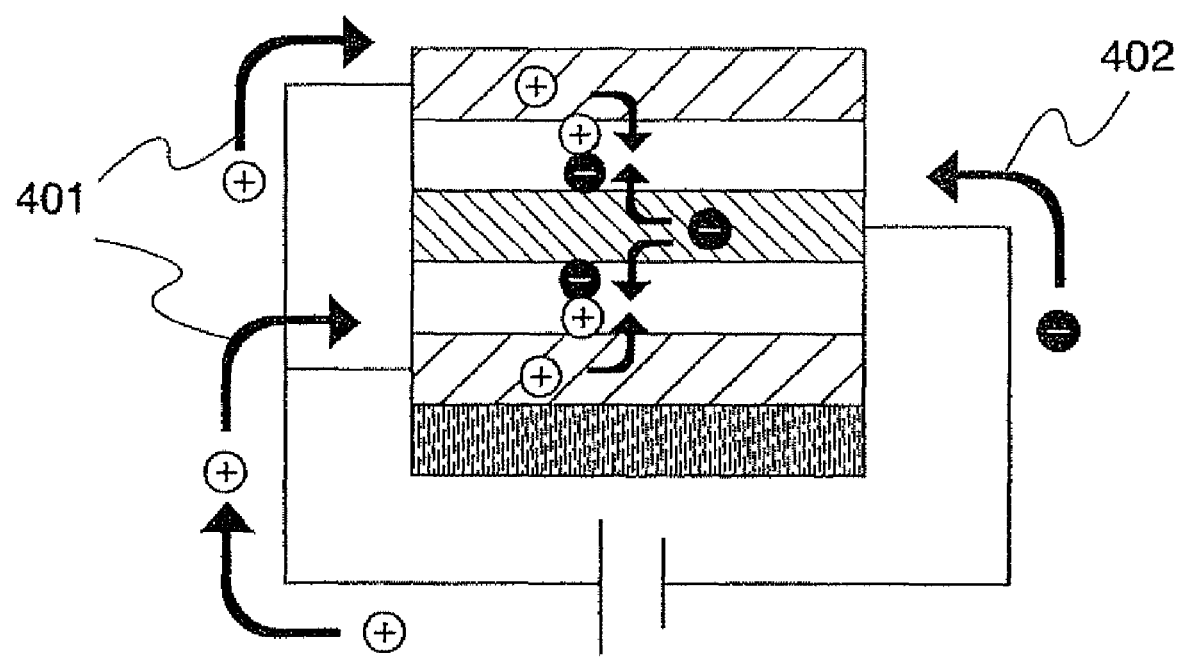
FIG. 4 is an illustration to show the state where electrons and holes flow in the minimum construction of the invention.

The state of flow of electrons and holes in a case where electric current is flowed through an element of the structure shown in FIG. 3 is shown in FIG. 4. The holes are injected from two anodes as shown by a reference numeral 401 in the drawing, and the electrons are injected into both of the upper and lower electroluminescent films from the center cathode as shown by a reference numeral 402. At this time, when an electric current of I is supplied from an external power source as shown by an arrow 501 in FIG. 5(B), an electric current of I/2 flows through each of the first anode and the second anode, as shown by an arrow 502 and then an electric current of I/2 flows through each of the first electroluminescent film and the second electroluminescent film. Assuming that the number of photons emitted when an electric current of I flows through one electroluminescent film is N, N/2 photons are emitted from each of the electroluminescent films, as shown by an arrow 503 and the total number of photons emitted from two electroluminescent films becomes N.

Figure 5A:
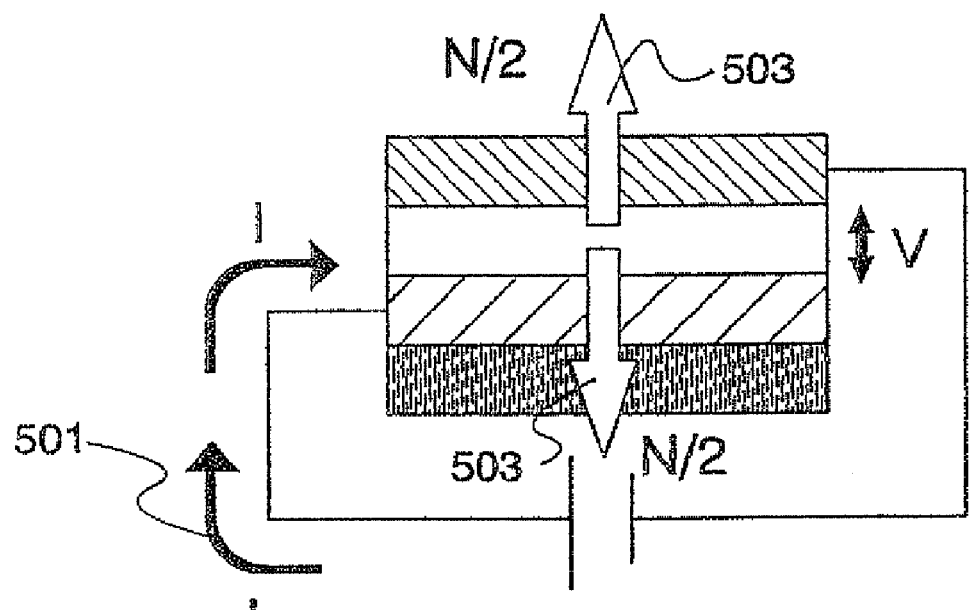
FIGS. 5(A) and 5(B) are illustrations to show the comparison between the invention and a prior art.
Figure 5B:
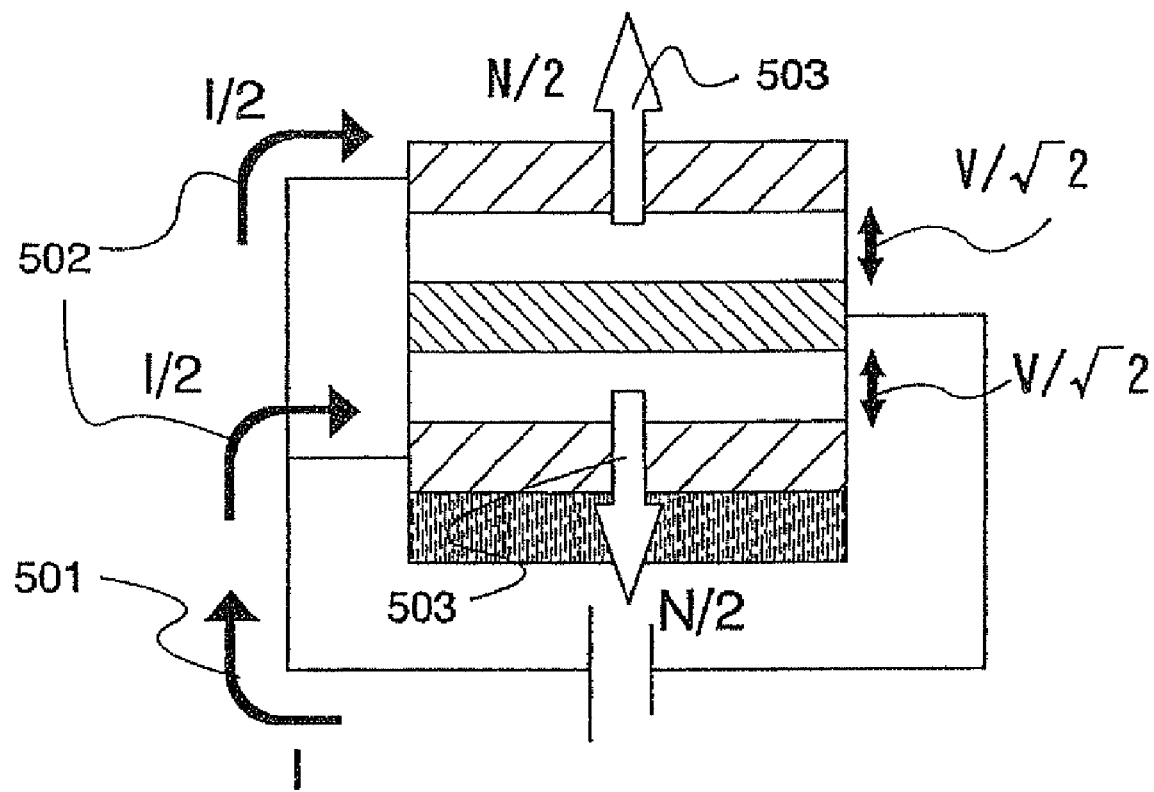

On the other hand, in a case where an electric current of I is flowed through an element of a structure, shown in FIG. 5(A), of sandwiching one electroluminescent film by an node and a cathode from an external power source, as shown by an arrow 501, N photons are emitted from the electroluminescent film, as is the case with FIG. 5(B).

Comparing FIG. 5(A) with FIG. 5(B), when a same number of photons are emitted, the amount of electric current supplied from the external power source is I in both cases, but in the case of using the structure shown in FIG. 5(B), the amount of electric current that is required to flow through one electroluminescent film is as little as I/2, which can hence reduce the deterioration of the electroluminescent film caused by the electric current.

Further, let's think about power consumption. Assuming that in the element having the structure shown in FIG. 5(A), the electric current required to emit N photons from the electroluminescent film is I and that a voltage required to flow the current of I is V, the power consumption P$_a$ of the element of this structure is as follows.

[Mathematical formula 3]

$$P_a = I \cdot V \quad (3)$$

In contrast to this, in the element shown in FIG. 5(B), the total electric current required to emit a total of N photons from two electroluminescent films is I but since a circuit is a parallel circuit, it is clear from the mathematical formula (1) that a voltage required to be supplied from the external power source is V/√2. Here, the electric power $P_b$ required to emit N photons by the element shown in FIG. 5(B) is shown as follows.

[Mathematical formula 4]

$$P_b = I/2 \times V/\sqrt{2} \times 2 = I \times V/\sqrt{2} \qquad (4)$$

In this manner, in the case of using the structure disclosed in the invention, electric power required to emit a same number of photons can be decreased by a factor of 1/√2 as compared with an element of a structure commonly used.

To realize the structure shown in FIG. 3, it is important to connect the anode 302 to the anode 306 without shorting of the anode 302 and the cathode 304 and without shorting of the cathode 304 and the anode 306. As for means for this purpose, selective coating by the use of a metal mask is suitably used.

While only a case where the number of the electroluminescent films is two has been described above, the invention can be also applied to a structure including three or more electroluminescent films shown in FIG. 1. Further, similarly, the invention can be also applied to the structure shown in FIG. 2.

Embodiment 1

In this embodiment, first, an electroluminescence device having an electroluminescent film of the invention in a pixel part will be described by the use of FIGS. 6(A) and 6(B). Here, FIG. 6(A) is a top view to show an electroluminescence device and FIG. 6(B) is a sectional view taken on a line B-B' in FIG. 6(A). A part 601, a part 602, and a part 603, each shown by a dotted line, are a drive circuit part (source side drive circuit), a pixel part, and a drive circuit part (gate side drive circuit), respectively. Further, a reference numeral 604 denotes a sealing substrate and 605 denotes a sealing agent, and an inside portion 607 surrounded by the seal agent 605 is a hollow space.

Here, a reference numeral 608 denotes a wiring for transmitting a signal to be input to the source side drive circuit 601 and the gate side drive circuit 603 and receives a video signal, a clock signal, a start signal, a reset signal, and the like from a FPC (flexible printed circuit) 609 that is an external input terminal. In this regard, only FPC is shown here but this FPC may be mounted with a printed wiring board (PWB). It is assumed that the electroluminescence device in this specification includes not only an electroluminescence device proper but also an electroluminescence device mounted with a FPC or a PWB.

Next, a sectional structure will be described by the use of FIG. 6(B). While the drive circuit part and the pixel part are formed over a substrate 610, the source side drive circuit 601 that is a drive circuit part and the pixel part 602 are shown here.

In this regard, a CMOS circuit of a combination of an n-channel type TFT 623 and a p-channel type TFT 624 is formed as the source side drive circuit 601. Further, the drive circuit may be formed of a PMOS circuit or an NMOS circuit. Still further, while a driver-integrated type in which a drive circuit is formed on a substrate is shown in this embodiment, a driver is not necessarily to be formed on a substrate but can be formed outside.

Further, the pixel part 602 is formed of a plurality of pixels including a TFT 611 for switching, a TFT 612 for electric current control, and the first anode 613 electrically connected to its drain. An insulator 614 is formed in such a manner as to cover the end of the first anode 613. Here, the insulator 614 is formed by the use of a positive acrylic resin film.

Still further, to improve a covering ratio, a curved surface having a curvature is formed on the top end portion or the bottom end portion of the insulator 614. For example, in the case of using a positive photosensitive acrylic resin as the material of the insulator 614, it is preferable that only the top end portion of the insulator 614 has a curved surface having a radius of curvature (from 0.2 μm to 3 μm). Moreover, both of a negative material that is made insoluble in enchant by photosensitive light and a positive material that is made soluble in enchant by the light can be used.

In this regard, the insulator 614 needs to have an anode contact 621 for connecting the first anode 613 to the second anode 619.

The first electroluminescent film 616, the first cathode 617, the second electroluminescent film 61B and the second anode 619 are formed on the first anode 613, respectively.

Here, it is desirable that a material having a large work function is used as a material used for the first anode 613 and the second anode 619. For example, not only a single layer film such as an ITO (indium tin oxide) film, an indium zinc oxide (IZO) film, a titanium nitride film, a chromium film, a tungsten film, a Zn film, and a Pt film, but also a laminated layer of a titanium nitride film and a film containing aluminum as a main component and a three-layer structure of a titanium nitride film, a film containing aluminum as a main component, and a titanium nitride film can be used.

Here, since at least one of the first anode 613 and the second anode 619 needs to be transparent enough to transmit light, a metal thin film that is thin enough to transmit light is used, or a transparent conductive film is used, or a laminated layer of a metal thin film and a transparent conductive film is used.

Further, the first electroluminescent film 616 and the second electroluminescent film 618 are formed by a vapor deposition method using a vapor-deposited mask or an ink jet method. As for a material used for an electroluminescent layer, a single layer or a laminated layer of an organic compound is used in many cases, but the invention includes a construction in which an inorganic compound is used for a portion of a film made of an organic compound.

Still further, it is recommended that a material having a small work function (Al, Ag, Li, or Ca, or an alloy of these elements MgAg, MgIn, AlLi, $CaF_2$, or CaN) be used as a material used for the first cathode 617 held between the first electroluminescent film 616 and the second electroluminescent film 618.

In this respect, to transmit light generated by the first electroluminescent film 616 and the second electroluminescent film 618 through the first cathode 617, it is recommended that a metal thin film having a thin film thickness, a transparent conductive film (ITO (alloy of indium oxide and tin oxide alloy), an alloy of indium oxide and zinc oxide ($In_2O_3$—ZnO), zinc oxide (ZnO), and the like), or a laminated layer of the metal thin film and the transparent conductive film be used.

In addition, by bonding a sealing substrate 604 to an element substrate 610 with a sealing agent 605, there is provided a structure in which the electroluminescent element 618 is provided in a space 607 surrounded by the element substrate 610, the sealing substrate 604, and the sealing agent 605. Here, the space 607 includes also a construction in which the space 607 is filled with inert gas (nitrogen, argon, and the like) or the sealing a gent 605.

In this regard, it is preferable that an epoxy base resin is used as the sealing agent 605. Further, it is desirable that these materials are ones that do not transmit moisture and oxygen to the extent possible. Still further, as a material used for the sealing substrate 604 can be used not only a glass substrate and quartz substrate but also a plastic substrate made of FRP (fiberglass-reinforced plastics), PVF (polyvinyl fluoride), Mylar, polyester, acrylic, or the like.

In this manner, the electroluminescence device having an electroluminescent element of the invention can be produced.

Embodiment 2

In this embodiment will be described the structure of an electroluminescent element in a case where an anode is used for an electrode at a position closest to a substrate.

The structure of a structure laminated on the first anode 613 will be described in detail. Here, an electroluminescent film and the first cathode 617 are manufactured by the vapor deposition method and a metal thin film that is thin enough to transmit light is used for the first cathode 617 and a transparent conductive film manufactured by the sputtering method is used for the second anode 619, and all these are patterned and manufactured by the use of a metal mask.

Figure 7:
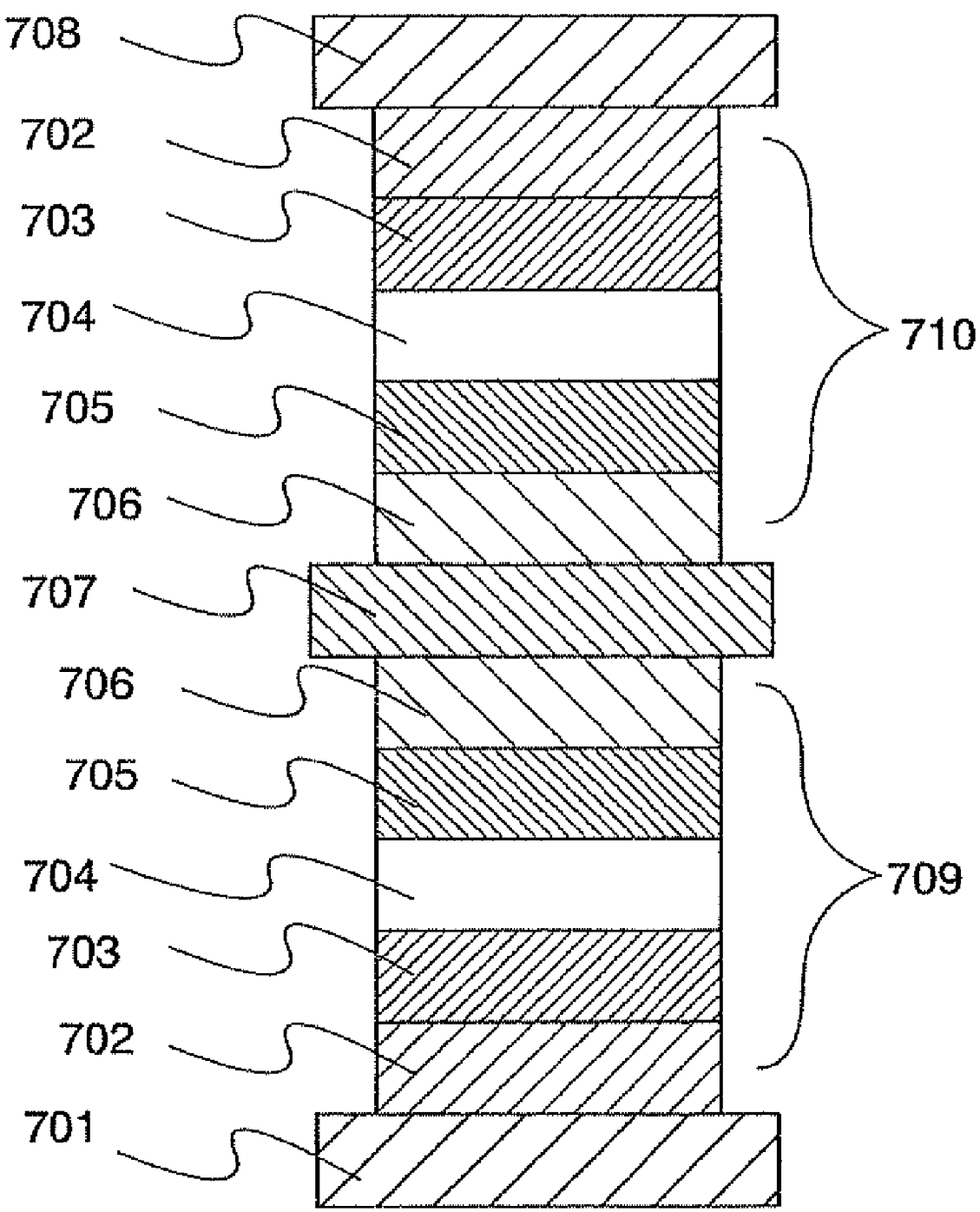
FIG. 7 is a detail illustration of an electroluminescent film (embodiment 2).

In FIG. 7 is shown the detailed structure of an electroluminescent element 620 in FIGS. 6(A) and 6(B). A hole injection layer 702, a hole transport layer 703, a electroluminescent layer 704, an electron transport layer 705, and an electron injection layer 706 are selectively formed over the first anode 613 by the use of the metal mask and are not formed over an anode contact part 621. Further, the metal mask is used properly so as to prevent the anode from becoming shorted with the cathode.

First, a film is formed of copper phthalocyanine (hereinafter shown by Cu-Pc) of a hole-injecting organic compound in a film thickness of 20 nm over the first anode 701 by the vapor deposition method to make the hole injection layer 702. Then, a film made of 4,4'-bis [N-(1-naphthyl)-N-phenyl-amino]-biphenyl (herein after shown by α-NPD) which is a hole-transporting organic compound is formed in a film thickness of 40 nm to make the hole transport layer 703.

Next, a film is formed of tris (8-quinolinolate) aluminum (herein after shown by $Alq_3$) of an electron-transporting electroluminescent organic compound in a film thickness of 37.5 nm over the hole transport layer 703 by the vapor deposition method to make the electroluminescent layer 704. Then, similarly, a film is formed of $Alq_3$ in a film thickness of 37.5 nm over the electroluminescent layer 704 to make the electron transport layer 705. The electroluminescent layer 704 and the electron transport layer 705 can be formed successively.

Further, to improve electron injection performance from the cathode, a film made of calcium fluoride (herein after shown by $CaF_2$) of an inorganic compound is formed in a film thickness of 1 nm to make the electron injection layer 706.

In this manner, the first electroluminescent film 709 can be obtained.

Further, a film of aluminum (herein after shown by Al) is formed as the first cathode 707 in a film thickness of 5 nm.

Thereafter, a film of $CaF_2$ is formed as an electron injection layer 706 in a film thickness of 1 nm over the first cathode 707, a film of $Alq_3$ is formed as an electron transport layer 705 in a film thickness of 37.5 nm, a film of $Alq_3$ is formed as a electroluminescent layer 704 in a film thickness of 37.5 nm, a film of γ-NPD is formed as a hole transport layer 703 in a film thickness of 40 nm, and a film of Cu-Pc is formed as a hole injection layer 702 in a film thickness of 20 nm. In this manner, the second electroluminescent film 710 can be obtained.

Further, the second anode 708 is formed by the sputtering method. At this time, the second anode 708 is connected to the first anode 613 through the anode contact part 621 shown in FIG. 6(B) and a metal mask is used to prevent the second anode 708 from becoming shorted with the first cathode 617 to control the portions where the films are formed.

Figure 9A:
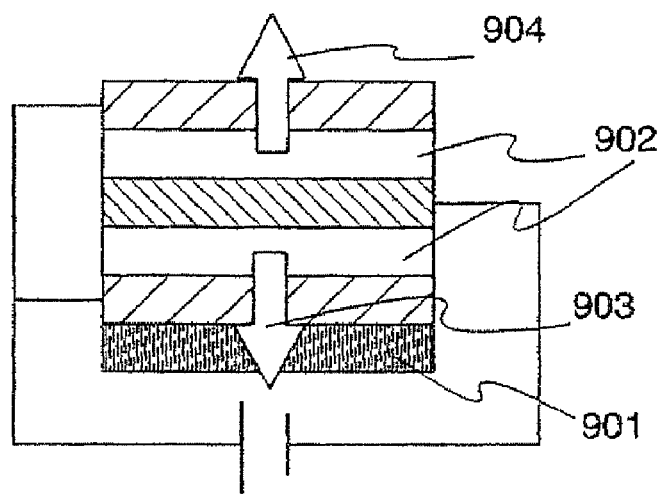
FIGS. 9(A), 9(B) and 9(C) are illustrations to show the direction in which light is emitted.

In this manner, the electroluminescent element 620 is completed. Here, light emitted from the electroluminescent element is emitted from both of a substrate side and a reverse side, as shown in FIG. 9(A), because all electrodes are transmissive.

Embodiment 3

In this embodiment will be described the structure of an electroluminescent element in a case where a cathode is used for an electrode at a position closest to a substrate.

Figure 8:
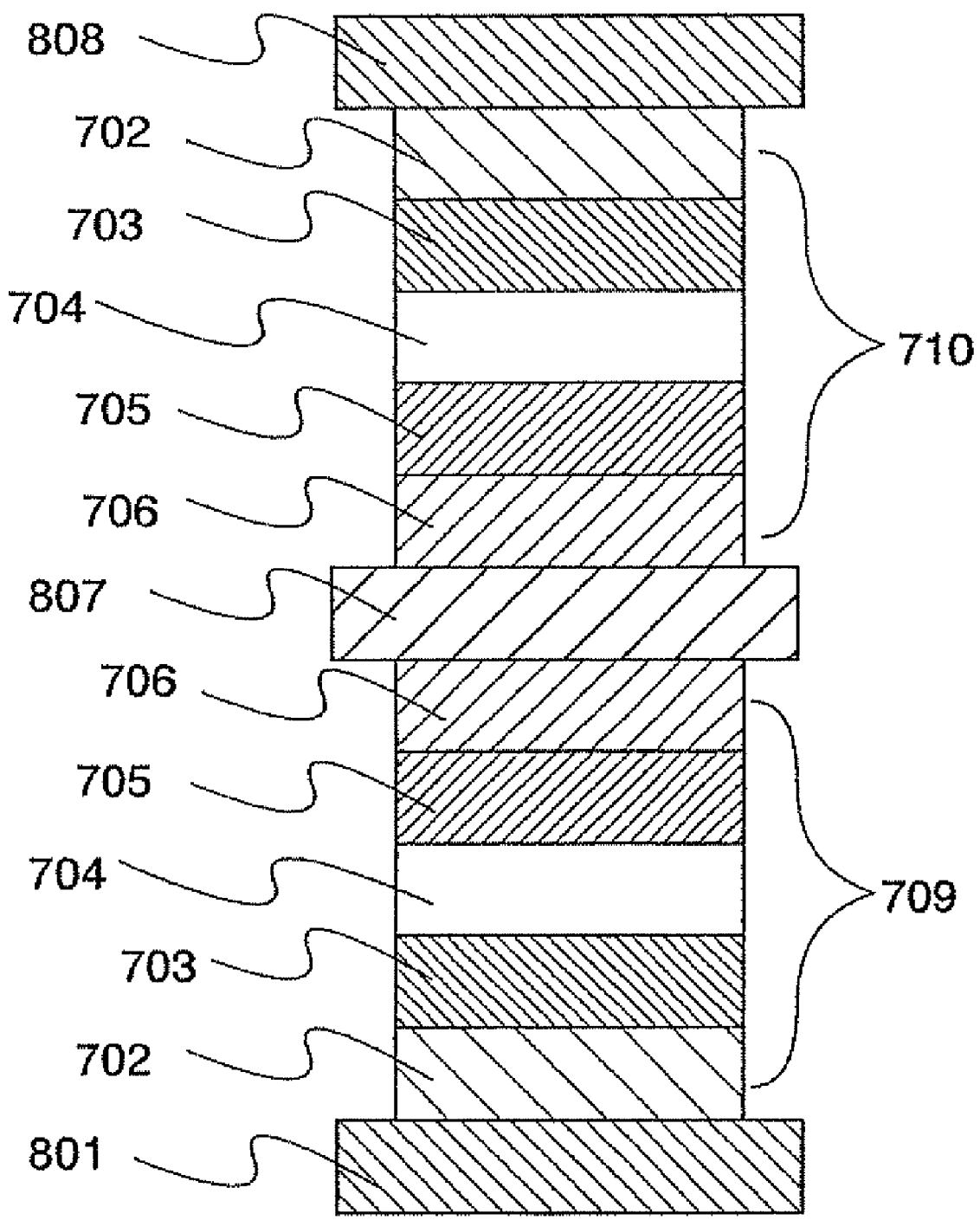
FIG. 8 is a detail illustration of an electroluminescent film (embodiment 3).

The structure of an electroluminescent element in a case where a cathode is used for an electrode at a position closest to a substrate and the relationship between the electroluminescent element and the electrode are shown in FIG. 8 and a reference numeral 801 in the drawing denotes the first cathode, 807 denotes the first anode, and 808 denotes the second cathode. Here, details of the respective layers constructing the respective electroluminescent films are the same as those in the above-described embodiment 2 and are denoted by the same reference numerals.

The element shown in this embodiment shows the same action as the element of the above-described embodiment 2.

Embodiment 4

Figure 9B:
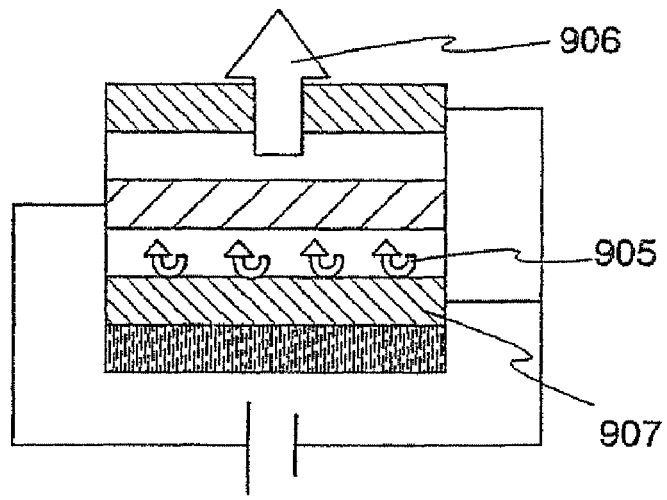

In this embodiment will be described a structure in which light is emitted only from the opposite side of the substrate, as shown in FIG. 9(B).

As shown in the above-described embodiment 3, an anode at a position closest to the substrate is made a cathode. However, the first cathode 907 is formed of Al as in a film thickness of 200 nm so as not to transmit light.

The structure except for the first cathode 907 can be the same as the above-described embodiment 2. Then, of light emitted from the electroluminescent layer, light emitted to the substrate side is reflected by the first cathode 907, as shown by an arrow 905, and hence light is emitted only from the opposite side of the substrate, as shown by an arrow 906 shown in FIG. 9(B).

In this manner, the structure in which light is emitted only from the opposite side of the substrate can be realized.

Embodiment 5

Figure 9C:
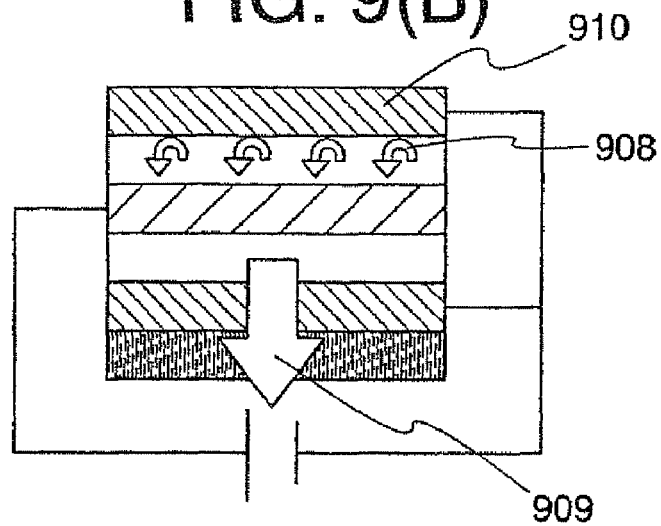

In this embodiment will be described a structure in which light is emitted only from a substrate side, as shown in FIG. 9(C).

As shown in the above-described embodiment 3, an anode at a position closest to the substrate is made a cathode. However, as shown in FIG. 9(C) a cathode 910 at a position farthest from the substrate is formed of Al in a film thickness of 200 nm so as not to transmit light.

The structure except for the first cathode can be the same as the above-described embodiment 2. Then, of light emitted from the electroluminescent layer, light emitted from the opposite side of the substrate is reflected by the cathode 910 of a thick film as shown by an arrow 908 and hence light is emitted only from the substrate side, as shown by an arrow 909 shown in FIG. 9(C).

In this manner, the structure in which light is emitted only from the substrate side can be realized.

Embodiment 6

In this embodiment will be described an electroluminescence device of emitting white light by the use of two electroluminescent elements each of which emits light of different color.

The construction of this embodiment is the same as that of the above-described embodiment 2 except for an electroluminescent layer.

In this embodiment, two electroluminescent layers are constructed of an electroluminescent element to emit blue light and an electroluminescent element to emit orange light which is in a relationship of complementary color to the blue light. Here, the relationship of complementary color means two different colors that can produce white light when lights of the two different colors are mixed with each other.

Since two electroluminescent layers are controlled by one power source system, both the electroluminescent layers emit at the same time to realize the emission of white light.

Embodiment 7

In this embodiment will be described an electroluminescence device of emitting white light by the use of three kinds of electroluminescent elements each of which emits different color.

A structure shown in this embodiment is a structure including three electroluminescent elements. This structure corresponds to a structure in a case where there are three electroluminescent elements sandwiched between the anode and the cathode in FIG. 1 and FIG. 2.

The structure of this embodiment is the same as that in embodiment 2 except for the electroluminescent layer.

In the structure including the above-described three electroluminescent elements, three electroluminescent elements each of which emits different color, including an electroluminescent element of emitting red light, an electroluminescent element of emitting green light, and an electroluminescent element of emitting blue light are used for the three electroluminescent layers, respectively.

Since these three electroluminescent elements are controlled by one power source system, they emit light at the same time to realize the emission of white light.

Embodiment 8

In this embodiment will be described various kinds of electric appliances completed by the use of an electroluminescence device having an electroluminescent element of the invention.

The electric appliances manufactured by the use of a electroluminescence device having an electroluminescent element of the invention include a video camera, a digital camera, a goggle type display (head-mounted display), a navigation system, an audio reproduction device (car audio device, audio component, and the like), a notebook personal computer, a game machine, a portable information terminal (mobile computer, mobile telephone, mobile game machine, electronic book, and the like), an image reproduction device provided with a recording medium (to be specific, a device of reproducing the recording medium such as digital video disk (DVD) and the like and provided with a display device capable of displaying a reproduced image), and the like. The embodiments of these concrete electric appliances are shown in FIG. 11.

FIG. 10(A) shows a display device that includes a case 1001, a support base 1002, a display part 1003, a speaker part 1004, a video input terminal 1005 and the like. This display device is manufactured by using an electroluminescence device having an electroluminescent element of the invention for the display part 1003. Here, the display device includes all devices for displaying information such as for personal computer, for the reception of TV broadcasting, and for the display of advertisement.

FIG. 10(B) shows a notebook personal computer that includes a main body 1101, a case 1102, a display part 1103, a keyboard 1104, an external connection port 1105, a pointing mouse 1106, and the like. This notebook personal computer is manufactured by using an electroluminescence device having an electroluminescent element of the invention for the display part 1103.

FIG. 10(C) shows a mobile computer that includes a main body 1201, a display part 1202, a switch 1203, an operating key 1204, an infrared ray port 1205, and the like. This mobile computer is manufactured by using an electroluminescence device having an electroluminescent element of the invention for the display part 1202.

FIG. 10(D) shows a mobile image reproduction device provided with a recording medium (to be specific, a DVD reproduction device) that includes a main body 1301, a case 1302, a display part A 1303, a display part B 1304, a recording medium (DVD and the like) reading part 1305, an operating key 1306, a speaker part 1307, and the like. The display part A 1303 displays mainly image information and the display part B displays mainly character information. This mobile image reproduction device is manufactured by using electroluminescence devices each having an electroluminescent element of the invention for these display parts A 1303 and B 1304. Here, the image reproduction device provided with a recording medium includes a game machine intended for home use and the like.

FIG. 10(E) shows a goggle type display (head-mounted display) that includes a main body 1401, a display part 1402, and an arm part 1403. This goggle type display is manufactured by using an electroluminescence device having an electroluminescent element of the invention for the display part 1402.

FIG. 10(F) shows a video camera that includes a main body 1501, a display part 1502, a case 1503, an external connection port 1504, a remote control reception part 1505, an image reception part 1506, a battery 1507, a voice input part 1508, an operating key 1509, an eye contact part 1510, and the like. This video camera is manufactured by using an electroluminescence device having an electroluminescent element of the invention for the display part 1502.

Here, FIG. 10(G) shows a mobile telephone that includes a main body 1601, a case 1602, a display part 1603, a voice input part 1604, a voice output part 1605, an operating key 1606, an external connection port 1607, an antenna 1608, and the like. This mobile telephone is manufactured by using an electroluminescence device having an electroluminescent element of the invention for the display part 1603. Here, the power consumption of the mobile telephone can be reduced by displaying white characters against a black background in the display part 1603.

As described above, the scope of application of the electroluminescence device having an electroluminescent element of the invention is extremely wide and this electroluminescence device can be applied to electric appliances in all fields.

The invention claimed is:

1. An electroluminescence device comprising;
a first electrode formed over a substrate;
an insulator covering an end of the first electrode;

a first electroluminescent film in contact with the first electrode and the insulator;
a second electrode in contact with the first electroluminescent film;
a second electroluminescent film in contact with the second electrode; and
a third electrode in contact with the second electroluminescent film, and
wherein the third electrode overlaps the first electrode, and
wherein the first electrode and the third electrode function as one of an anode or a cathode and the second electrode functions as the other of the anode or the cathode.

2. An electroluminescence device comprising;
a first electrode formed over a substrate;
an insulator covering an end of the first electrode;
a first electroluminescent film over the first electrode and the insulator;
a second electrode over the first electroluminescent film;
a second electroluminescent film over the second electrode; and
a third electrode over the second electroluminescent film.

3. An electroluminescence device according to claim 2,
wherein the first electrode and the third electrode function as one of an anode or a cathode and the second electrode functions as the other of the anode or the cathode.

4. An electric appliance comprising;
a first electrode over a substrate;
an insulator covering an end of the first electrode;
a first electroluminescent film over the first electrode;
a second electrode over the first electroluminescent film and the insulator;
a second electroluminescent film over the second electrode; and
a third electrode over the second electroluminescent film,
wherein a first light emitting color of the first electroluminescent film and a second light emitting color of the second electroluminescent film are in a relationship of complementary colors.

5. An electric appliance according to claim 4,
wherein the first electrode and the third electrode function as one of an anode or a cathode and the second electrode functions as the other of the anode or the cathode.

6. An electric appliance according to claim 4,
wherein a first electroluminescent element comprising the first electroluminescent film is configured to emit a green light and a second electroluminescent element comprising the second electroluminescent film is configured to emit an orange light.

7. An electric appliance according to claim 4,
wherein a first electroluminescent element comprising the first electroluminescent film is configured to emit an orange light and a second electroluminescent element comprising the second electroluminescent film is configured to emit a green light.

8. An electric appliance comprising:
a first electrode over a substrate;
an insulator covering an end of the first electrode;
a first electroluminescent film over the first electrode;
a second electrode over the first electroluminescent film and the insulator;
a second electroluminescent film over the second electrode;
a third electrode over the second electroluminescent film;
a third electroluminescent film over the third electrode; and
a fourth electroluminescent film over the third electroluminescent film;
wherein a first light emitting color of the first electroluminescent film are different from a second light emitting color of the second electroluminescent film,
wherein the second light emitting color are different from a third light emitting color of the third electroluminescent film,
wherein the third light emitting color are different from the first light emitting color, and
wherein the electric appliance is configured to emit a white light.

9. An electric appliance according to claim 8,
wherein one of the first, second, and third light emitting colors is a red, green, or blue color.

10. An electroluminescence device comprising;
a first electrode formed over a substrate;
an insulator covering an end of the first electrode;
a first electroluminescent film in contact with the first electrode and the insulator;
a second electrode in contact with the first electroluminescent film and over the first electrode;
a second electroluminescent film in contact with the second electrode; and a third electrode in contact with the second electroluminescent film and over the second electrode, and
wherein the first electrode and the third electrode function as one of an anode or a cathode and the second electrode functions as the other of the anode or the cathode.

* * * * *